(12) United States Patent
Chen et al.

(10) Patent No.: US 11,143,237 B2
(45) Date of Patent: Oct. 12, 2021

(54) SLIDE RAIL ASSEMBLY AND RAIL KIT THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

(*) Notice: Subject to any disclaimer, the term of this patent is extended or adjusted under 35 U.S.C. 154(b) by 0 days.

(21) Appl. No.: 16/809,799

(22) Filed: Mar. 5, 2020

(65) Prior Publication Data

US 2021/0115972 A1    Apr. 22, 2021

(30) Foreign Application Priority Data

Oct. 18, 2019    (TW) .................................. 108137980

(51) Int. Cl.
*A47B 88/44* (2017.01)
*F16C 29/10* (2006.01)
*F16C 29/04* (2006.01)

(52) U.S. Cl.
CPC .............. *F16C 29/10* (2013.01); *A47B 88/44* (2017.01); *F16C 29/045* (2013.01)

(58) Field of Classification Search
CPC ......... A47B 88/44; F16C 29/10; F16C 29/045

USPC ................................ 312/333, 334.46, 334.8
See application file for complete search history.

(56) References Cited

U.S. PATENT DOCUMENTS

| | | | |
|---|---|---|---|
| 6,412,891 B1 * | 7/2002 | Liang .................... | A47B 88/487 312/334.44 |
| 6,935,710 B2 | 8/2005 | Chen et al. | |
| 6,945,619 B1 * | 9/2005 | Chen .................... | A47B 88/467 312/334.47 |
| 7,726,755 B2 * | 6/2010 | Peng ...................... | A47B 88/40 312/334.46 |
| 10,111,357 B2 | 10/2018 | Chen | |
| 10,274,009 B2 | 4/2019 | Chen et al. | |
| 2004/0174100 A1 | 9/2004 | Chen et al. | |
| 2006/0078235 A1 * | 4/2006 | Chen .................... | A47B 88/493 384/18 |

(Continued)

FOREIGN PATENT DOCUMENTS

| | | |
|---|---|---|
| JP | 3138146 U | 12/2007 |
| JP | 2018-015525 A | 2/2018 |

(Continued)

OTHER PUBLICATIONS

Search Report dated Nov. 16, 2020 for corresponding EP Application No. 20167093.2.

*Primary Examiner* — James O Hansen
(74) *Attorney, Agent, or Firm* — Rosenberg, Klein & Lee

(57) ABSTRACT

A slide rail assembly includes a rail kit. The rail kit includes a rail, a blocking member, and an operating member. The rail has an extension hole. The blocking member is movably disposed on the rail. The operating member is disposed on the rail, can be operated in order to drive the blocking member, and includes an operating portion corresponding to a portion of the extension hole of the rail.

15 Claims, 8 Drawing Sheets

(56) References Cited

U.S. PATENT DOCUMENTS

| | | | |
|---|---|---|---|
| 2006/0244349 A1* | 11/2006 | Chen | A47B 88/493 |
| | | | 312/334.47 |
| 2009/0096340 A1 | 4/2009 | Chen et al. | |
| 2010/0019638 A1 | 1/2010 | Duan et al. | |
| 2018/0031037 A1 | 2/2018 | Chen et al. | |
| 2019/0200756 A1 | 7/2019 | Chen et al. | |

FOREIGN PATENT DOCUMENTS

| | | |
|---|---|---|
| JP | 2019-118788 A | 7/2019 |
| TW | 201803492 A | 2/2018 |

\* cited by examiner

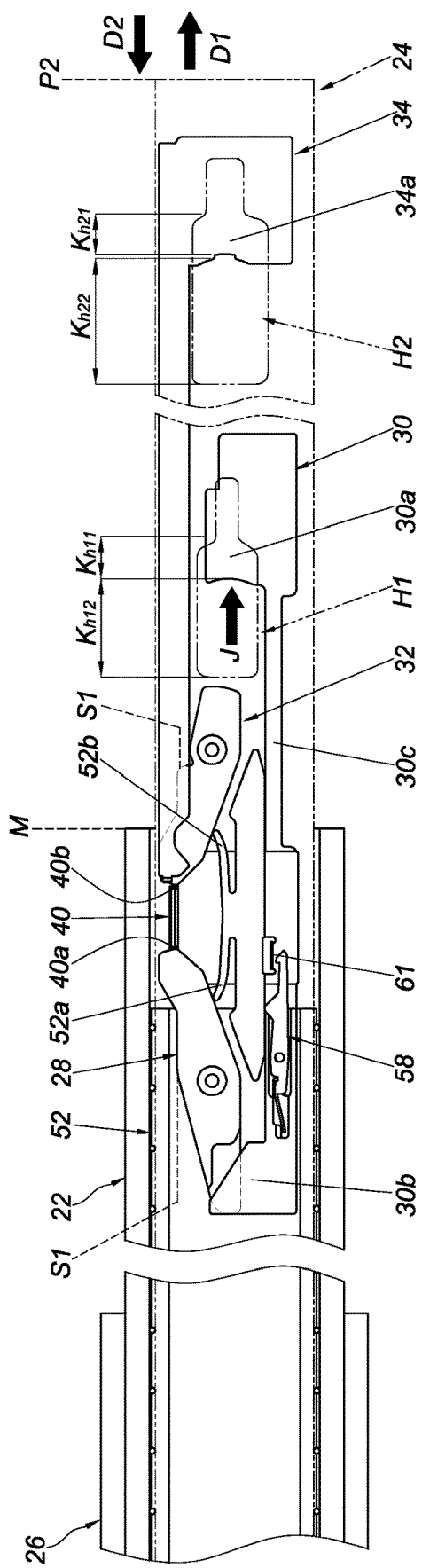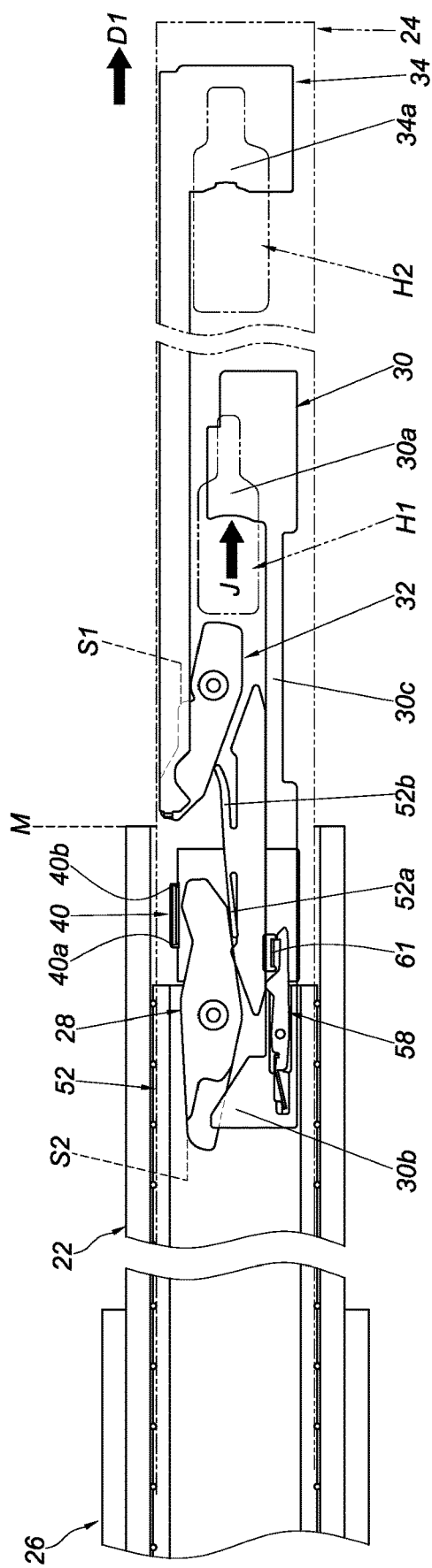

SLIDE RAIL ASSEMBLY AND RAIL KIT THEREOF

FIELD OF THE INVENTION

The present invention relates to a slide rail mechanism and more particularly to a slide rail assembly with an easy-to-operate operating member.

BACKGROUND OF THE INVENTION

U.S. Pat. No. 10,274,009 B2 discloses in FIG. 5 a slide rail assembly that includes a first rail, a second rail, and a third rail. The first rail is movably mounted between the second rail and the third rail and is provided with a blocking feature adjacent to the front end of the first rail. The second rail is provided with not only a first working member and a second working member, but also a first operating member and a second operating member with which to operate the first working member and the second working member respectively.

As shown in FIG. 12 of the specification of the afore-cited patent, when the second rail is at an extended position with respect to the first rail, the first working member and the second working member are respectively blocked at two opposite sides of the blocking feature of the first rail to keep the second rail at the extended position, and one who wishes to retract the second rail from the extended position in a retracting direction may apply a force through their finger to the operating part (e.g., the first operating part) of one of the first operating member and the second operating member in order to drive the first working member and thereby free the first working member from blockage by the blocking feature of the first rail.

Given the trend toward thinner and thinner slide rail assemblies to satisfy specific user needs, the rails disclosed in the afore-cited patent and the functional components therebetween (e.g., the first operating member or the second operating member) may be required to have their thicknesses reduced, which nevertheless gives rise to difficulties in operation. For example, it can be known from FIG. 12 of the afore-cited patent that when the first operating member (or the second operating member) becomes thinner, it will be difficult to apply a force through one's finger to the first operating part of the first operating member (or the second operating part of the second operating member) in order to pull (or push) the operating part and thereby drive the first working member (or the second working member). It is therefore important to develop a slide rail product different from that disclosed in the afore-cited patent.

SUMMARY OF THE INVENTION

The present invention provides a slide rail assembly whose slide rail operating member is easy to operate.

According to one aspect of the present invention, a slide rail assembly includes a first rail, a second rail, a blocking member, and an operating member. The first rail is provided with a blocking portion. The second rail can be displaced with respect to the first rail from a retracted position to an extended position and has an extension hole. The blocking member is movably disposed on the second rail. The operating member has an operating portion configured to be operated in order for the operating member to drive the blocking member and thereby bring the blocking member from a first state to a second state. The operating portion corresponds to a portion of the extension hole of the second rail. When the second rail reaches the extended position after being displaced with respect to the first rail, and when the blocking member is in the first state, a blocking relationship is established between the blocking member and the blocking portion of the first rail. When the second rail reaches the extended position after being displaced with respect to the first rail but the blocking member is in the second state, the blocking relationship between the blocking member and the blocking portion of the first rail is not established.

Preferably, the blocking portion is adjacent to the front end of the first rail.

Preferably, the blocking member is pivotally connected to the second rail.

Preferably, the slide rail assembly further includes an elastic member for applying an elastic force to the blocking member so that the blocking member can stay in the first state in response to the elastic force of the elastic member.

Preferably, the operating member has an actuating portion corresponding to the blocking member, is disposed on the second rail, and is configured to be linearly displaced when operated.

Preferably, the slide rail assembly further includes a third rail, and the first rail is movably mounted between the third rail and the second rail.

According to another aspect of the present invention, a slide rail assembly includes a first rail, a second rail, a first blocking member, and a first operating member. The first rail has a first upper wall, a first lower wall, and a first sidewall connected between the first upper wall and the first lower wall. The first upper wall, the first lower wall, and the first sidewall jointly define a channel, and a blocking portion is disposed on the first sidewall. The second rail is movably mounted in the channel of the first rail and has a second upper wall, a second lower wall, and a second sidewall connected between the second upper wall and the second lower wall. The second sidewall has a first extension hole. The first blocking member is movably disposed on the second sidewall of the second rail and corresponds to the blocking portion of the first rail. The first operating member is configured to be operated and thereby drive the first blocking member. The first operating member is disposed on the second sidewall of the second rail and includes a first operating portion corresponding to a portion of the first extension hole of the second rail. An operator can displace the first operating member simply by operating the first operating portion with a finger inserted into the first extension hole of the second rail.

According to yet another aspect of the present invention, a rail kit includes a rail, a first blocking member, a second blocking member, and an operating member. The rail includes an upper wall, a lower wall, and a sidewall connected between the upper wall and the lower wall, wherein the sidewall has an extension hole. The first blocking member is movably disposed on the sidewall of the rail, and so is the second blocking member. The first blocking member and the second blocking member define a space therebetween. The operating member is configured to be operated and thereby drive one of the first blocking member and the second blocking member. The operating member is disposed on the sidewall of the rail and includes an operating portion corresponding to a portion of the extension hole of the rail.

BRIEF DESCRIPTION OF THE DRAWINGS

FIG. 6 is a schematic view of the slide rail assembly according to the embodiment of the present invention, showing that the slide rail assembly is in an extended state;

FIG. 7 is a schematic view of the slide rail assembly according to the embodiment of the present invention, showing that the first rail is at the opened position with respect to the third rail, and that the second rail is further displaced with respect to the first rail in the first direction;

DETAILED DESCRIPTION OF THE INVENTION

Figure 1:
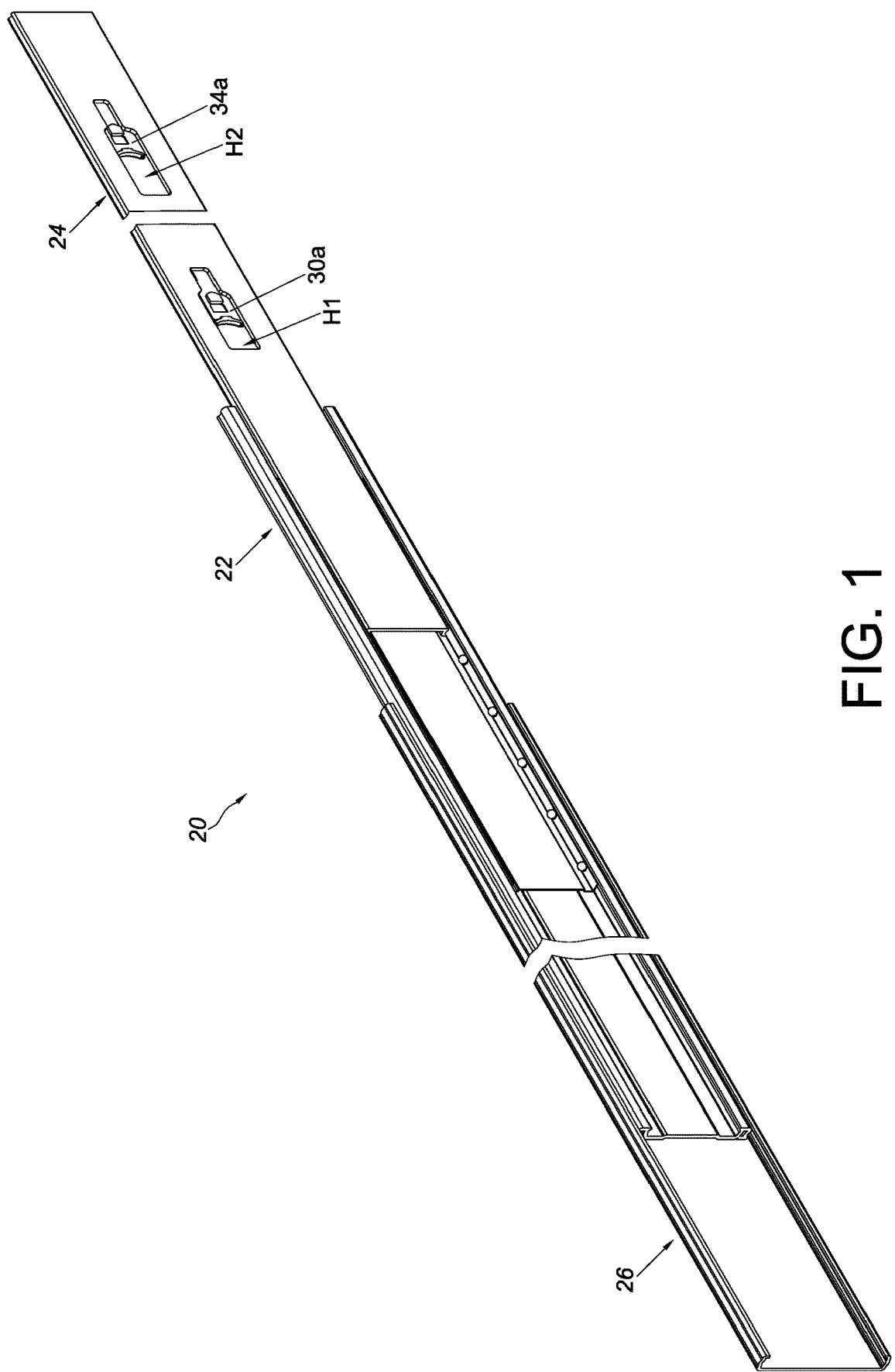
FIG. 1 is a perspective view of the slide rail assembly according to an embodiment of the present invention.
Figure 2:
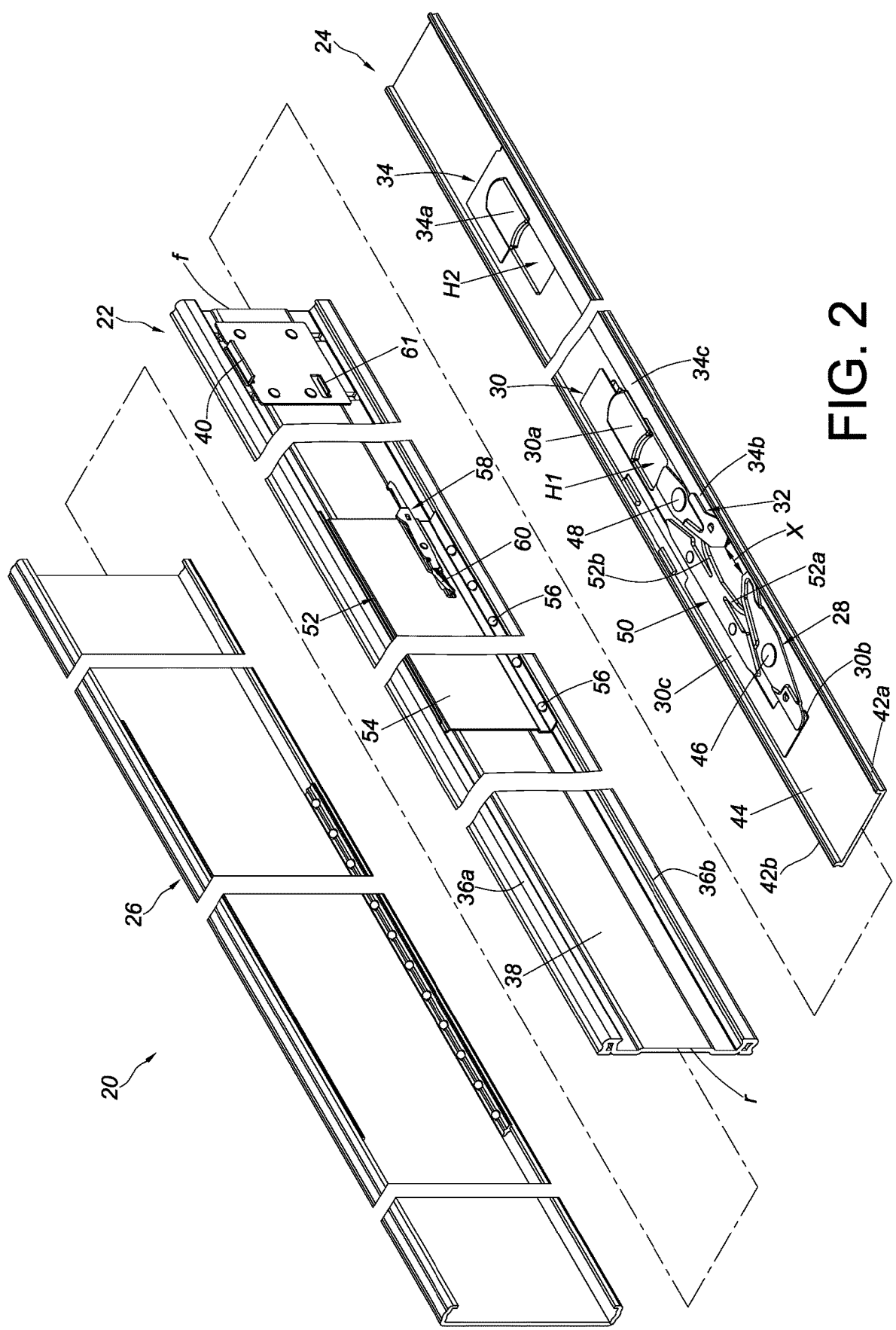
FIG. 2 is an exploded perspective view of the slide rail assembly according to the embodiment of the present invention, showing that the slide rail assembly includes a first rail, a second rail, and a third rail.

As shown in FIG. 1 and FIG. 2, the slide rail assembly 20 according to an embodiment of the present invention includes a first rail 22, a second rail 24, and preferably also a third rail 26. The first rail 22 is movably mounted between the second rail 24 and the third rail 26 to increase the distance for which the second rail 24 can be displaced with respect to the third rail 26. Preferably, the slide rail assembly 20 further includes a first blocking member 28, a first operating member 30, a second blocking member 32, and a second operating member 34. The second rail 24, the first blocking member 28, the second blocking member 32, and the first operating member 30 constitute a rail kit.

The third rail 26 includes a channel for receiving the first rail 22.

The first rail 22 has a first upper wall 36a, a first lower wall 36b, and a first sidewall 38 connected between the first upper wall 36a and the first lower wall 36b. The first upper wall 36a, the first lower wall 36b, and the first sidewall 38 jointly define a channel A blocking portion 40 is disposed on the first sidewall 38, and the blocking portion 40 protrudes transversely (or laterally) with respect to the first sidewall 38 by way of example only. Preferably, the blocking portion 40 is adjacent to the front end f of the first sidewall 38 of the first rail 22, wherein the front end f is distant from the rear end r of the first rail 22.

The second rail 24 is movably mounted in the channel of the first rail 22. The second rail 24 has a second upper wall 42a, a second lower wall 42b, and a second sidewall 44 connected between the second upper wall 42a and the second lower wall 42b. The second sidewall 44 has a first extension hole H1 and preferably also a second extension hole H2.

The first blocking member 28 is movably disposed on the second sidewall 44 of the second rail 24. Preferably, the first blocking member 28 is pivotally connected to the second sidewall 44 of the second rail 24 by a first shaft 46.

The first operating member 30 is configured to be operated and thereby drive the first blocking member 28. The first operating member 30 is disposed on the second sidewall 44 of the second rail 24. The first operating member 30 includes a first operating portion 30a, and the first operating portion 30a corresponds to a portion of the first extension hole H1 of the second rail 24. Preferably, the first operating member 30 further includes a first actuating portion 30b and a first extension body 30c, the former of which corresponds to the first blocking member 28, and the latter of which is connected between the first actuating portion 30b and the first operating portion 30a. The first extension body 30c of the first operating member 30 is adjacent to one of the second upper wall 42a and the second lower wall 42b of the second rail 24. Here, the first extension body 30c of the first operating member 30 is adjacent to the second lower wall 42b of the second rail 24 by way of example only.

The second blocking member 32 is movably disposed on the second sidewall 44 of the second rail 24. Preferably, the second blocking member 32 is pivotally connected to the second sidewall 44 of the second rail 24 by a second shaft 48.

The second operating member 34 is configured to be operated and thereby drive the second blocking member 32. The second operating member 34 is disposed on the second sidewall 44 of the second rail 24. The second operating member 34 includes a second operating portion 34a, and the second operating portion 34a corresponds to a first portion of the second extension hole H2 of the second rail 24. Preferably, the second operating member 34 further includes a second actuating portion 34b and a second extension body 34c, the former of which corresponds to the second blocking member 32, and the latter of which is connected between the second actuating portion 34b and the second operating portion 34a. The second extension body 34c of the second operating member 34 is adjacent to the other of the second upper wall 42a and the second lower wall 42b of the second rail 24. Here, the second extension body 34c of the second operating member 34 is adjacent to the second upper wall 42a of the second rail 24 by way of example only.

Preferably, the slide rail assembly 20 further includes a first elastic member 52a for applying an elastic force to the first blocking member 28 and a second elastic member 52b for applying an elastic force to the second blocking member 32. Here, the first elastic member 52a and the second elastic member 52b are disposed on a base 50, and the base 50 is connected to the second sidewall 44 of the second rail 24 by way of example only.

Preferably, the first blocking member 28 and the second blocking member 32 define a space X therebetween for receiving the blocking portion 40 of the first rail 22.

Preferably, a slide facilitating mechanism is disposed between each two adjacent rails of the slide rail assembly 20. For example, a slide facilitating device 52 is disposed between the first rail 22 and the second rail 24 to help the first rail 22 and the second rail 24 to displace smoothly with respect to each other. The slide facilitating device 52 includes a main body 54, a plurality of slide facilitating members 56 (e.g., rolling balls or rolling wheels), and a fastening member 58. The slide facilitating members 56 are disposed on the main body 54 and are supported between the first rail 22 and the second rail 24. The fastening member 58 is movably mounted on (e.g., pivotally connected to) the main body 54. Preferably, the fastening member 58 can be kept in a predetermined state (e.g., a locking state) by the elastic force of an elastic feature 60. The first rail 22 further includes an engaging portion 61 configured to work with the fastening member 58. The engaging portion 61 protrudes transversely (or laterally) with respect to the first sidewall 38 of the first rail 22.

Figure 3:
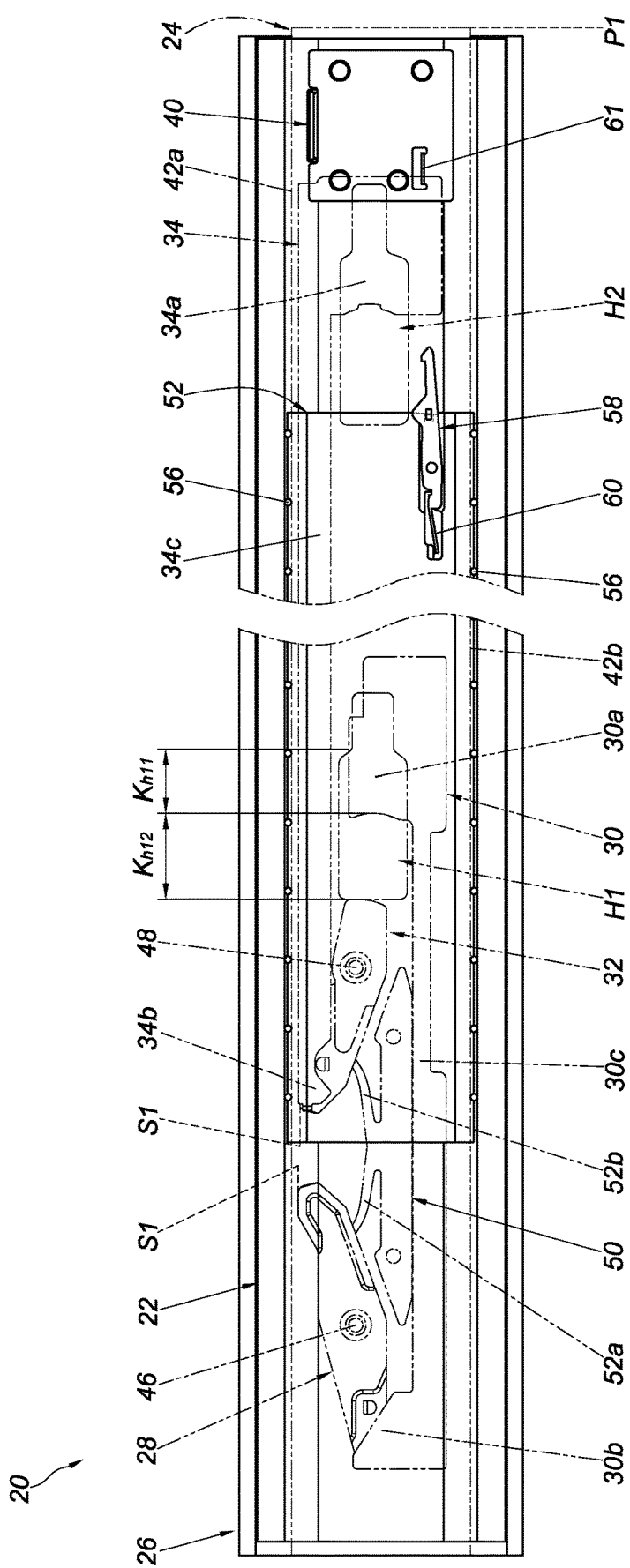
FIG. 3 is a schematic view of the slide rail assembly according to the embodiment of the present invention, showing that the slide rail assembly is in a retracted state.

FIG. 3 shows the slide rail assembly 20 in a retracted state in which the first rail 22 is retracted with respect to the third rail 26 and the second rail 24 is at a retracted position P1 with respect to the first rail 22. Wherein, the first operating portion 30a of the first operating member 30 corresponds to the first extension hole H1 of the second rail 24, and the second operating portion 34a of the second operating member 34 corresponds to the second extension hole H2 of the second rail 24. As the structural configurations and working principle of the first operating member 30 (or more particularly its first operating portion 30a) and the first extension hole H1 are the same as those of the second operating member 34 (or more particularly its second operating portion 34a) and the second extension hole H2, the following description is directed mainly to the relationship between the first operating member 30 and the first extension hole H1 for the sake of brevity.

With continued reference to FIG. 3, the first operating portion 30a of the first operating member 30 corresponds to, for example, a first portion $K_{h11}$ of the first extension hole H1 of the second rail 24, and an operator can insert a finger into a second portion $K_{h12}$ of the first extension hole H1. In addition, the first blocking member 28 corresponds to the blocking portion 40 of the first rail 22. Preferably, the first elastic member 52a applies an elastic force to the first blocking member 28, and the first blocking member 28 stays in a first state S1 in response to the elastic force of the first elastic member 52a. The first blocking member 28 in the first state S1 corresponds in position to the blocking portion 40 of the first rail 22. Similarly, the second elastic member 52b applies an elastic force to the second blocking member 32 such that the second blocking member 32 stays in the first state S1 in response to the elastic force of the second elastic member 52b. The second blocking member 32 in the first state S1 corresponds in position to the blocking portion 40 of the first rail 22 too. The fastening member 58 of the slide facilitating device 52 and the engaging portion 61 of the first rail 22 are spaced apart by a predetermined longitudinal distance.

Figure 4:
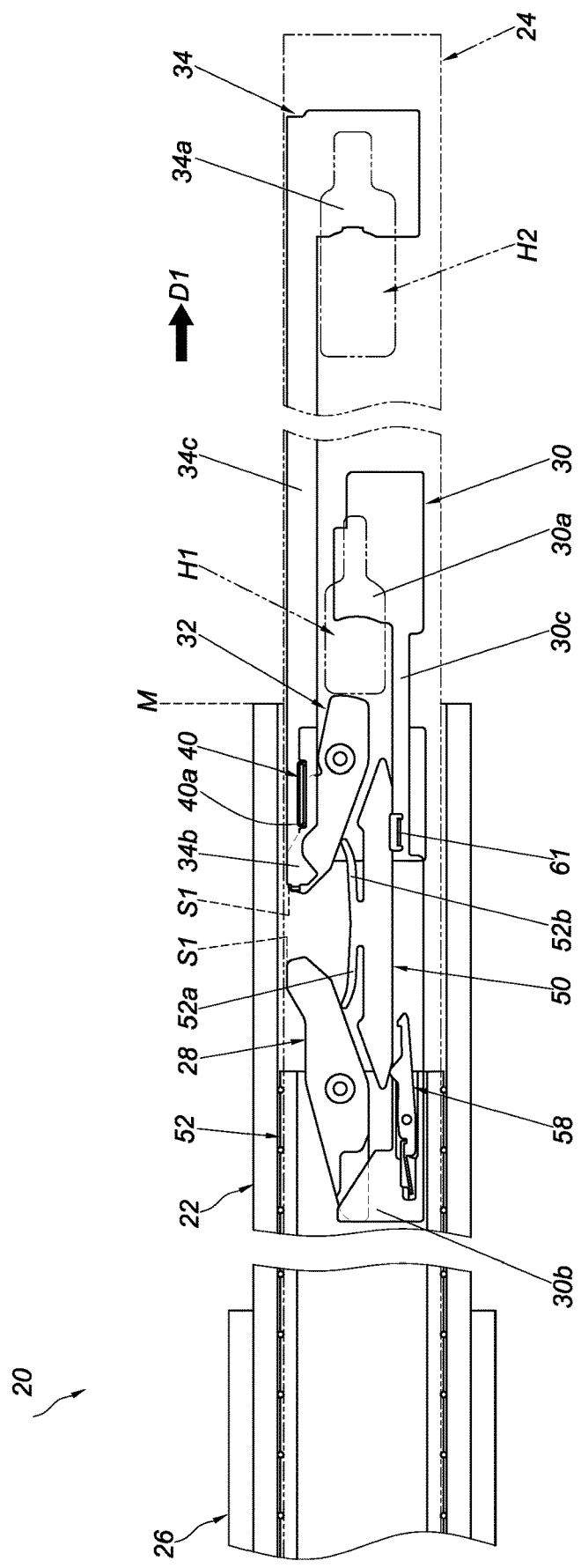
FIG. 4 is a schematic view of the slide rail assembly according to the embodiment of the present invention, showing that the first rail is at an opened position with respect to the third rail, and that the second rail is displaced with respect to the first rail in a first direction.

In FIG. 4, the first rail 22 is at an opened position M with respect to the third rail 26 and hence cannot be arbitrarily displaced with respect to the third rail 26 (the underlying principle of which should be comprehensible to people of ordinary skill in the art and therefore will not be explained herein). When the second rail 24 is displaced with respect to the first rail 22 in a first direction D1 (e.g., an opening direction) and reaches a predetermined position, the second blocking member 32 in the first state S1 is brought into contact with a first blocking section 40a of the blocking portion 40 of the first rail 22. During the process, the slide facilitating device 52 is also displaced in the first direction D1 along with the second rail 24. It is worth mentioning that after the foregoing displacement of the second rail 24, the fastening member 58 of the slide facilitating device 52 is held down by the base 50 and no longer in the aforesaid predetermined state; for example, the fastening member 58 ends up in a non-locking state.

Figure 5:
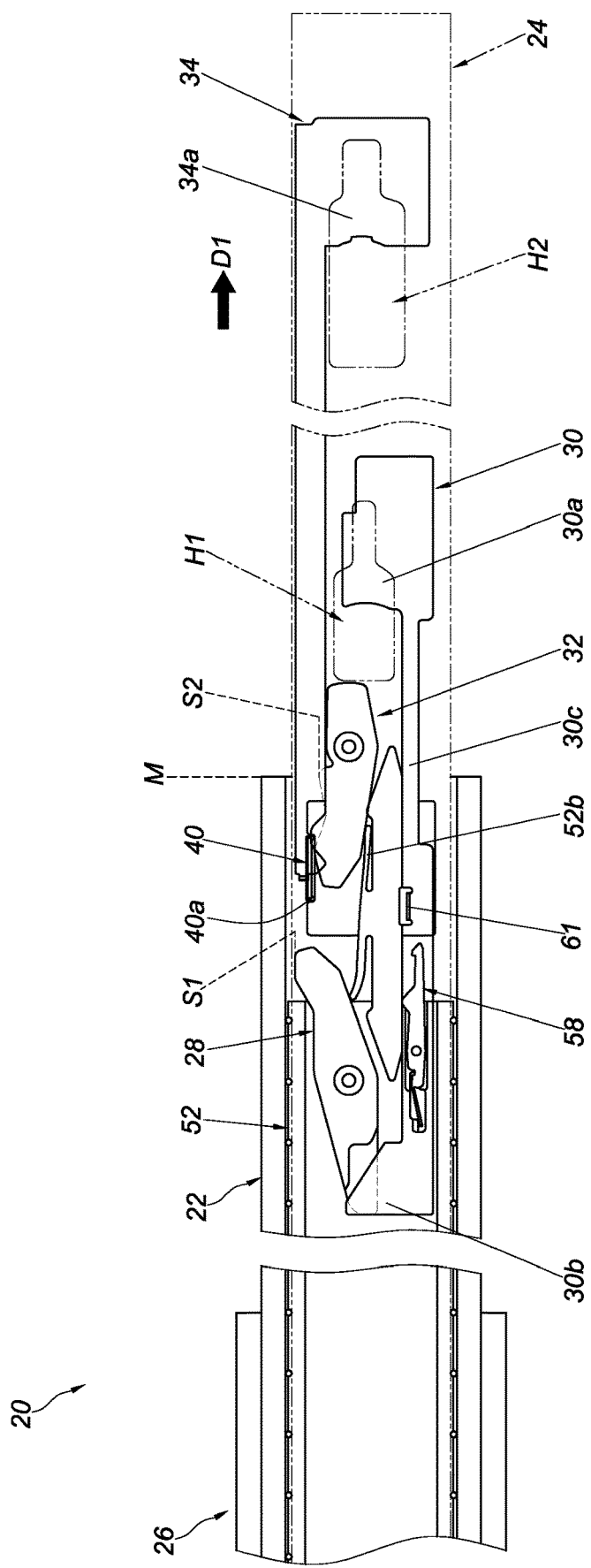
FIG. 5 is a schematic view of the slide rail assembly according to the embodiment of the present invention, showing that the first rail is at the opened position with respect to the third rail, and that the second rail is further displaced with respect to the first rail in the first direction.

When the second rail 24 is further displaced with respect to the first rail 22 in the first direction D1, referring to FIG. 5, the contact between the second blocking member 32 and the blocking portion 40 of the first rail 22 results in a force that pivots the second blocking member 32 through an angle and thereby brings the second blocking member 32 to a second state S2. As the displacement of the second rail 24 continues, the second blocking member 32, now in the second state S2, is moved past the first blocking section 40a of the blocking portion 40 of the first rail 22, and the second elastic member 52b accumulates an elastic force. During the process, the slide facilitating device 52 is further displaced in the first direction D1 along with the second rail 24.

FIG. 6 shows the slide rail assembly 20 in an extended state (e.g., a fully extended state). More specifically, when the second rail 24 reaches an extended position P2 after being displaced with respect to the first rail 22 in the first direction D1, the second blocking member 32 arrives at a second blocking section 40b of the blocking portion 40 of the first rail 22 (the second blocking section 40b and the first blocking section 40a being at two opposite positions of the blocking portion 40 respectively, but not necessarily so in practice) and returns to the first state S1 in response to the second elastic member 52b releasing the elastic force accumulated therein. Thus, the second blocking member 32 is blocked by, i.e., establishes a blocking relationship with, the second blocking section 40b of the blocking portion 40 to prevent the second rail 24 from being displaced with respect to the first rail 22 from the extended position P2 in a second direction D2 (e.g., a retracting direction), which is the opposite direction of the first direction D1. On the other hand, the first blocking member 28 remains in the first state S1 and is blocked by, i.e., establishes a blocking relationship with, the first blocking section 40a of the blocking portion 40 to prevent the second rail 24 from being displaced with respect to the first rail 22 from the extended position P2 in the first direction D1. The blocking portion 40 in this state is engaged in the space X (see FIG. 2) between the first blocking member 28 and the second blocking member 32.

When it is desired to displace the second rail 24 with respect to the first rail 22 from the extended position P2, referring to FIG. 6 and FIG. 7, the user only has to operate one of the first operating member 30 and the second operating member 34 (with the operating portion of the one of the first operating member 30 and the second operating member 34 corresponding to a portion of an extension hole of the second rail 24), and the second rail 24 will be able to be displaced with respect to the first rail 22 from the extended position P2 in either the first direction D1 or the second direction D2. In this embodiment, the first operating portion 30a of the first operating member 30 corresponds to the first portion $K_{h11}$ of the first extension hole H1 of the second rail 24, and the second portion $K_{h12}$ of the first extension hole H1 allows insertion by the operator's finger so that the first operating portion 30a can be easily operated to displace the first operating member 30. More specifically, by inserting a finger through the second portion $K_{h12}$ of the first extension hole H1, the user can easily apply a force J to and thereby operate the first operating portion 30a so as to displace the first operating member 30 linearly (or longitudinally), the objective being for the first actuating portion 30b of the first operating member 30 to drive the first blocking member 28 and thereby bring the first blocking member 28 from the first state S1 to the second state S2 (as shown in FIG. 7), in which state the first blocking member 28 is no longer blocked by, i.e., no longer in the aforesaid blocking relationship with, the first blocking section 40a of the blocking portion 40 and therefore allows the second rail 24 to be displaced with respect to the first rail 22 from the extended position P2 in the first direction D1. Wherein, the fastening member 58 of the slide facilitating device 52 is adjacent to the engaging portion 61.

Figure 8:
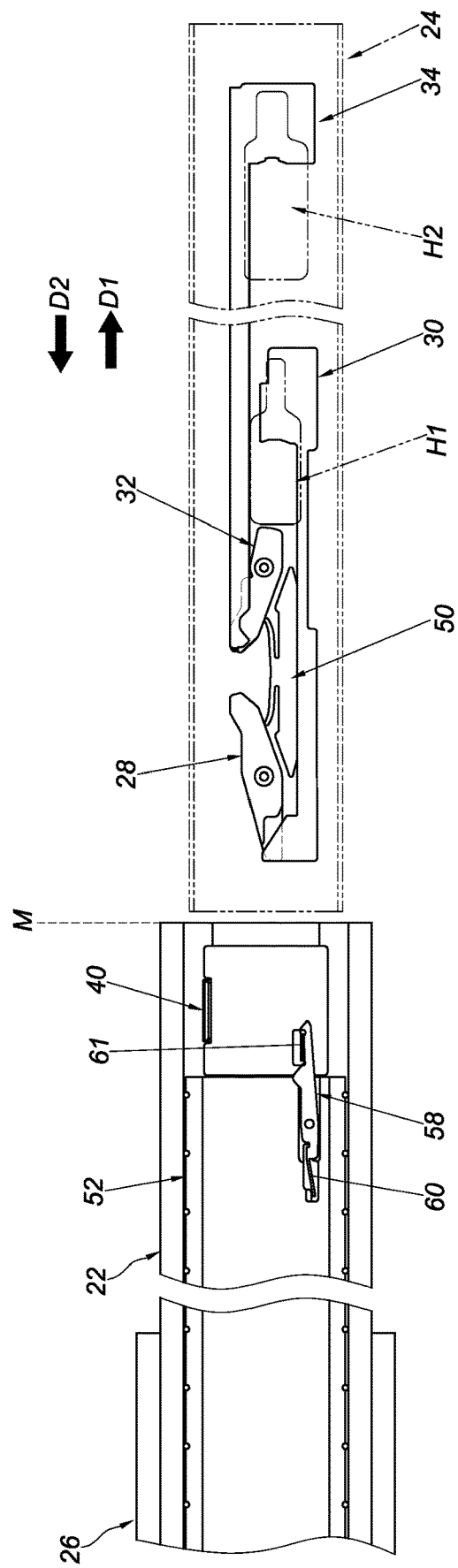
FIG. 8 is a schematic view of the slide rail assembly according to the embodiment of the present invention, showing that the first rail is at the opened position with respect to the third rail, and that the second rail is detached with respect to the first rail in the first direction.

In FIG. 8, the second rail 24 is detached with respect to the first rail 22 from the extended position P2 in the first direction D1, so the fastening member 58 of the slide facilitating device 52 is no longer held down by the base 50, has returned to its predetermined state (e.g., the aforesaid locking state) in response to the elastic feature 60 releasing the elastic force accumulated therein, and is now fastened to the engaging portion 61 to keep the slide facilitating device 52 at an ideal position. It is worth mentioning that by mounting the second rail 24 back into the channel of the first rail 22 in the second direction D2 with respect to the first rail 22, a portion (e.g., the rear end) of the second rail 24 will drive the fastening member 58 out of engagement with the engaging portion 61.

Figure 9:
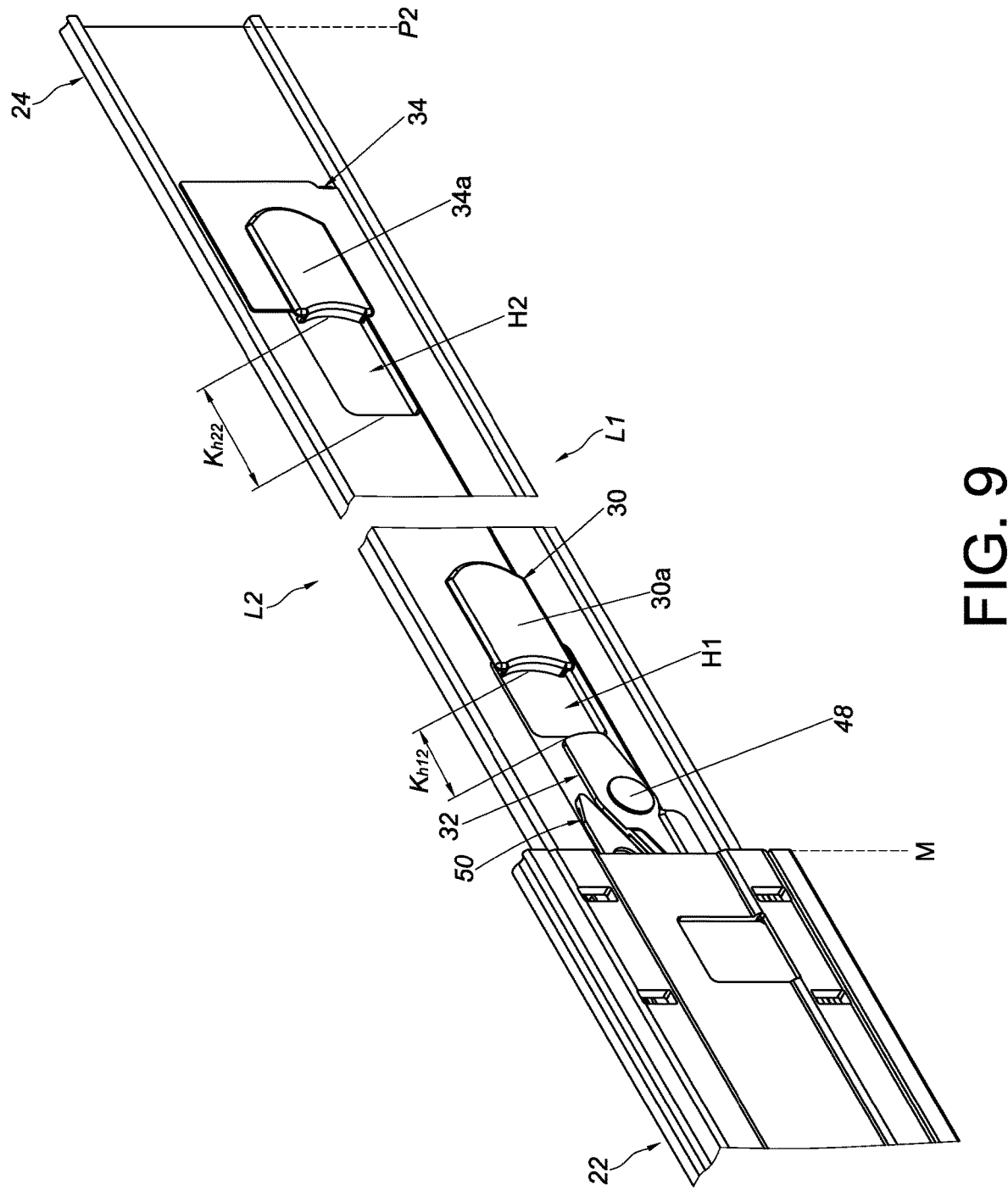
FIG. 9 is a perspective view of the slide rail assembly according to the embodiment of the present invention, showing that the second rail is at an extended position with respect to the first rail.

Referring to FIG. 9, the second rail 24 has a first side L1 and a second side L2, which is the opposite side of the first side L1. The first operating portion 30a corresponds to the first portion $K_{h11}$ (see FIG. 6) of the first extension hole H1 of the second rail 24, and the second operating portion 34a corresponds to the first portion $K_{h21}$ (see FIG. 6) of the second extension hole H2 of the second rail 24.

A user may put a finger through the second portion $K_{h12}$ of the first extension hole H1 from the first side L1 of the second rail 24 to the second side L2 of the second rail 24 and can then easily apply the force J to the first operating portion 30a in order to operate the first operating portion 30a and thereby displace the first operating member 30. The first operating member 30 will in turn drive the first blocking member 28 into the second state S2 from the first state S1; as a result, the first blocking member 28 is freed from blockage by, and from the aforesaid blocking relationship with, the first blocking section 40a of the blocking portion 40 and allows the second rail 24 to be detached by being displaced with respect to the first rail 22 from the extended position P2 in the first direction D1.

Alternatively, the user may put a finger through the second portion $K_{h22}$ of the second extension hole H2 from the first side L1 of the second rail 24 to the second side L2 of the second rail 24 and can then easily apply another force to the second operating portion 34a in order to operate the second operating portion 34a and thereby displace the second operating member 34. The second operating member 34 will in turn drive the second blocking member 32 into the second state S2 from the first state S1; as a result, the second blocking member 32 is freed from blockage by, and from the aforesaid blocking relationship with, the second blocking section 40b of the blocking portion 40 and allows the second rail 24 to be retracted by being displaced with respect to the first rail 22 from the extended position P2 in the second direction D2.

Unlike its prior art counterparts, the slide rail assembly 20 according to this embodiment is so designed that the two opposite sides of the second rail 24 are in communication with each other through the extension holes (i.e., the first extension hole H1 and the second extension hole H2), and that therefore a user may put a finger through either of the extension holes from the first side L1 or the second side L2 of the second rail 24 in order to apply a force to the operating portion (e.g., the first operating portion 30a or the second operating portion 34a) of, and thereby displace, the corresponding operating member (e.g., the first operating member 30 or the second operating member 34). The operating member being displaced will drive the corresponding blocking member (e.g., the first blocking member 28 or the second blocking member 32) to allow either detachment of the second rail 24 with respect to the first rail 22 from the extended position P2 in the first direction D1, or retraction of the second rail 24 with respect to the first rail 22 from the extended position P2 in the second direction D2.

As a whole, the extension holes in the second rail 24 of the slide rail assembly 20 solve the problem that it will be more and more difficult to apply a force to the increasingly thinner operating members of the conventional slide rails. This feature allows the slide rail assembly 20 to be operated in an easy and reliable manner even if the thickness of the slide rail assembly 20 is reduced.

While the present invention has been disclosed through the foregoing preferred embodiment, the embodiment is not intended to be restrictive of the scope of the invention. The scope of patent protection sought by the applicant is defined by the appended claims.

What is claimed is:

1. A slide rail assembly, comprising:
   a first rail provided with a blocking portion;
   a second rail displaceable with respect to the first rail from a retracted position to an extended position, wherein the second rail has an extension hole;
   a blocking member movably disposed on the second rail; and
   an operating member having an operating portion configured to be operated to change from a first state to a second state in order for the operating member to drive the blocking member and thereby bring the blocking member from a first state to a second state, wherein the operating portion corresponds to a first portion of the extension hole of the second rail, the operating member exposing a second portion of the extension hole in both the first state and the second state of the operating portion;
   wherein when the second rail reaches the extended position after displacement with respect to the first rail and the blocking member is in the first state, a blocking relationship is established between the blocking member and the blocking portion of the first rail;
   wherein when the second rail reaches the extended position after displacement with respect to the first rail but the blocking member is in the second state, the blocking relationship between the blocking member and the blocking portion of the first rail is not established.

2. The slide rail assembly of claim 1, wherein the blocking portion is adjacent to a front end of the first rail.

3. The slide rail assembly of claim 2, wherein the blocking member is pivotally connected to the second rail.

4. The slide rail assembly of claim 3, further comprising an elastic member for applying an elastic force to the blocking member in order for the blocking member to stay in the first state in response to the elastic force of the elastic member.

5. The slide rail assembly of claim 4, wherein the operating member has an actuating portion corresponding to the blocking member, and the operating member is disposed on the second rail and is configured to be linearly displaced when operated.

6. The slide rail assembly of claim 5, further comprising a third rail, wherein the first rail is movably mounted between the second rail and the third rail.

7. A slide rail assembly, comprising:
   a first rail having a first upper wall, a first lower wall, and a first sidewall connected between the first upper wall and the first lower wall, wherein the first upper wall, the first lower wall, and the first sidewall jointly define a channel, and a blocking portion is disposed on the first sidewall;

a second rail movably mounted in the channel of the first rail, wherein the second rail has a second upper wall, a second lower wall, and a second sidewall connected between the second upper wall and the second lower wall, and the second sidewall has a first extension hole;

a first blocking member movably disposed on the second sidewall of the second rail and corresponding to the blocking portion of the first rail; and a first operating member configured to be displaced from a first position to a second position and thereby drive the first blocking member, wherein the first operating member is disposed on the second sidewall of the second rail, the first operating member includes a first operating portion, the first operating portion corresponds to a first portion of the first extension hole of the second rail, and the first operating member exposes a second portion of the first extension hole in both the first position and the second position;

wherein the second portion of the first extension hole of the second rail allows insertion therethrough by an operator's finger to operate the first operating portion and thereby displace the first operating member from the first position to the second position.

8. The slide rail assembly of claim 7, wherein the blocking portion is adjacent to a front end of the first sidewall of the first rail.

9. The slide rail assembly of claim 8, wherein the first blocking member is pivotally connected to the second sidewall of the second rail.

10. The slide rail assembly of claim 9, further comprising a first elastic member for applying an elastic force to the first blocking member in order for the first blocking member to stay in a first state in response to the elastic force of the first elastic member, wherein the first blocking member corresponds to the blocking portion of the first rail when in the first state.

11. The slide rail assembly of claim 10, wherein the first operating member has a first actuating portion corresponding to the first blocking member, and the first operating member is disposed on the second rail and is configured to be linearly displaced when operated.

12. The slide rail assembly of claim 11, wherein the first operating member has an extension body, and the extension body is adjacent to one of the second upper wall and the second lower wall of the second rail.

13. The slide rail assembly of claim 12, further comprising a third rail, wherein the first rail is movably mounted between the third rail and the second rail.

14. A slide rail assembly, comprising:
a first rail having a first upper wall, a first lower wall, and a first sidewall connected between the first upper wall and the first lower wall, wherein the first upper wall, the first lower wall, and the first sidewall jointly define a channel, and a blocking portion is disposed on the first sidewall;

a second rail movably mounted in the channel of the first rail, wherein the second rail has a second upper wall, a second lower wall, and a second sidewall connected between the second upper wall and the second lower wall, and the second sidewall has a first extension hole;

a first blocking member movably disposed on the second sidewall of the second rail and corresponding to the blocking portion of the first rail;

a first operating member configured to be operated and thereby drive the first blocking member, wherein the first operating member is disposed on the second sidewall of the second rail, the first operating member includes a first operating portion, and the first operating portion corresponds to a portion of the first extension hole of the second rail;

a second blocking member movably disposed on the second sidewall of the second rail, a second elastic member for applying an elastic force to the second blocking member; and a second operating member configured to be operated and thereby drive the second blocking member, wherein the second operating member has a second actuating portion corresponding to the second blocking member, and the first blocking member and the second blocking member define a space therebetween for receiving the blocking portion of the first rail, wherein the first extension hole of the second rail allows insertion by an operator's finger so that the first operating portion is able to be operated with ease in order to displace the first operating member.

15. The slide rail assembly of claim 14, wherein the second sidewall of the second rail further has a second extension hole, the second operating member includes a second operating portion, and the second operating portion corresponds to a portion of the second extension hole of the second rail.

* * * * *